United States Patent
Tao et al.

(10) Patent No.: US 6,194,128 B1
(45) Date of Patent: Feb. 27, 2001

(54) METHOD OF DUAL DAMASCENE ETCHING

(75) Inventors: Hun-Jan Tao, Hsinchu; Chao-Cheng Chen, Tainan; Chia-Shiung Tsai, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/156,053

(22) Filed: Sep. 17, 1998

(51) Int. Cl.⁷ .............................. G03F 7/00; H01L 21/027
(52) U.S. Cl. ..................... 430/313; 430/317; 216/41; 438/637; 438/689; 438/761
(58) Field of Search .................... 430/313, 317; 216/41; 438/637, 689, 761

(56) References Cited

U.S. PATENT DOCUMENTS

| | | | |
|---|---|---|---|
| 4,832,789 | * 5/1989 | Cochran | 156/644 |
| 4,915,779 | * 4/1990 | Srodes | 156/643 |
| 4,963,815 | * 10/1990 | Hafeman | 324/715 |
| 5,529,953 | 6/1996 | Shoda | 437/189 |
| 5,578,523 | 11/1996 | Fiordalice et al. | 437/190 |
| 5,605,637 | 2/1997 | Shan et al. | 216/71 |
| 5,614,765 | 3/1997 | Avanzino et al. | 257/774 |
| 5,686,354 | 11/1997 | Avanzino et al. | 437/190 |
| 5,693,563 | 12/1997 | Teong | 437/190 |
| 5,696,395 | * 12/1997 | Tseng | 257/308 |
| 5,702,982 | 12/1997 | Lee et al. | 437/195 |
| 5,705,849 | 1/1998 | Zheng et al. | 257/530 |
| 5,741,626 | 4/1998 | Jain et al. | 430/314 |
| 5,741,741 | * 4/1998 | Tseng | 438/637 |
| 5,880,018 | * 3/1999 | Boeck | 438/619 |
| 5,897,375 | * 4/1999 | Watts | 438/693 |
| 5,906,948 | * 5/1999 | Liu | 438/689 |
| 6,037,664 | * 3/2000 | Zhao | 257/758 |

OTHER PUBLICATIONS

Yu, "Processing for forming vias in metal interlayer dielectrics", Derwent Abstract TW 344120A Nov. 1998.*

* cited by examiner

Primary Examiner—Mark F. Huff
Assistant Examiner—Nicole Barreca
(74) Attorney, Agent, or Firm—George O. Saile; Stephen B. Ackerman

(57) ABSTRACT

A novel method of dual damascene etching is disclosed. It is shown that the performance of ULSI circuits can be improved by shrinking interconnect dimensions through the use of dual damascene processes, using hard-masks to achieve vertical walls and hence smaller spaces in the damascene structures, introducing low-k (dielectric constant) insulating materials to reduce RC delays, and metallizing with copper without the deleterious effects of bridging after CMP. These are accomplished by using a novel recipe for etching the hard-masks used in a dual damascene process and still another recipe for etching low-k dielectric layers in three different combinations with oxide-based dielectric layers.

48 Claims, 3 Drawing Sheets

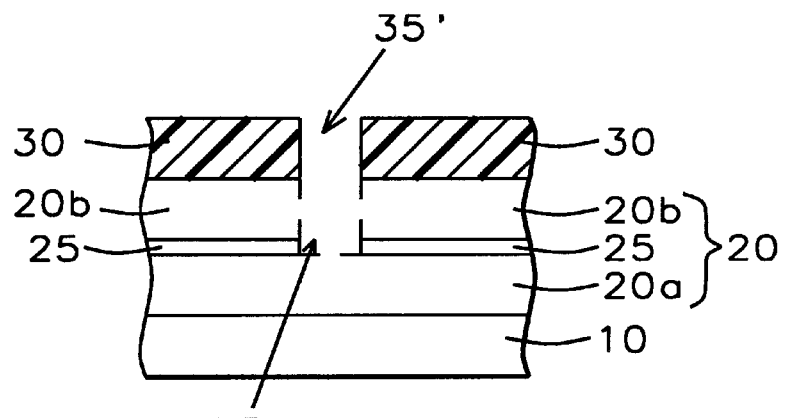
FIG. 1a – Prior Art
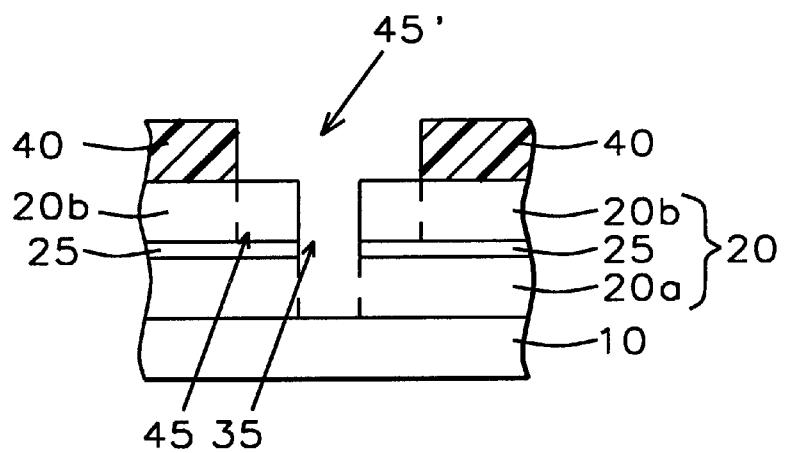
FIG. 1b – Prior Art
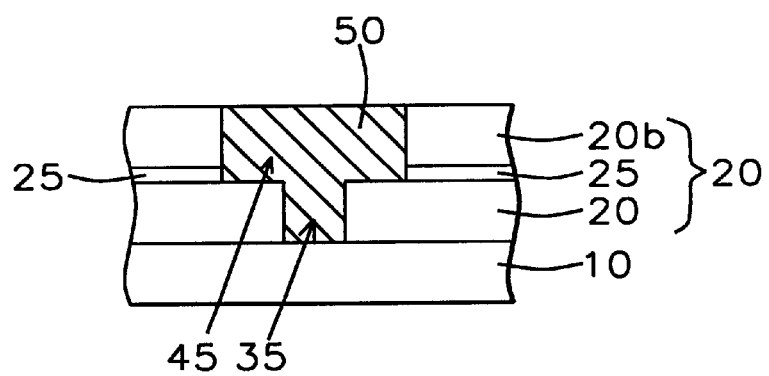
FIG. 1c – Prior Art

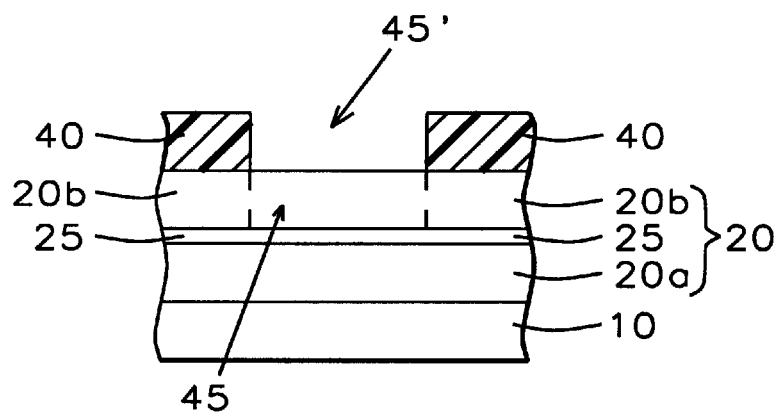
FIG. 2a – Prior Art
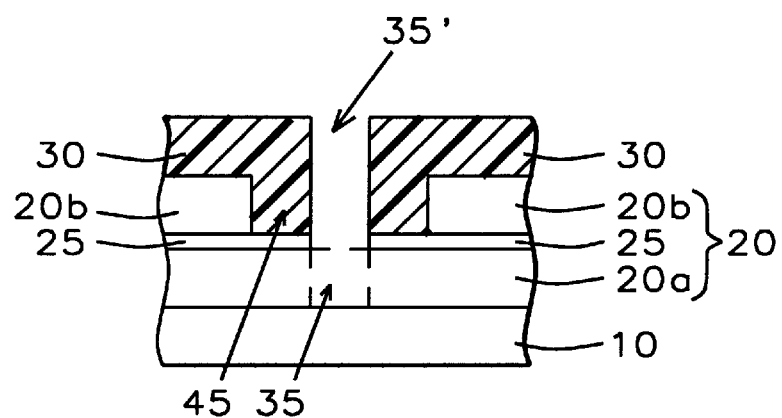
FIG. 2b – Prior Art
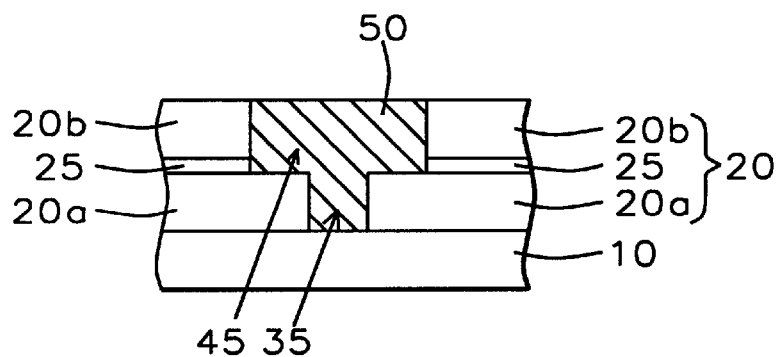
FIG. 2c – Prior Art

METHOD OF DUAL DAMASCENE ETCHING

BACKGROUND OF THE INVENTION

(1) Field of the Invention

The present invention relates to the manufacture of ultra large scale integrated (ULSI) circuit chips in general, and in particular, to forming dual damascene interconnects in a semiconductor substrate through the use of a novel method of etching.

(2) Description of the Related Art

In a damascene process, which is descried more fully below, grooves and holes are formed in an insulating material by etching which are then filled with metal. Metal in grooves form the horizontal metal line interconnects while the metal in the underlying holes form the vertical connections to the layers of metal interconnects formed in the previous damascene structure. The holes that interconnect metal lines at different levels in a semiconductor substrate are known as via holes. If the damascene structure forms the first level of metal, then the underlying holes may contact the substrate itself, in which case the holes are referred to as contact holes. Because the grooves and the holes in a damascene structure are filled with metal together, the interface resistance that would normally occur between a metal line that is deposited over a previously formed metal in the via or contact hole of the prior art method is eliminated. Hence, the damascene structure is a significant improvement over prior art.

In addition to the electrical resistance at metal interfaces, the conductivity of the metal interconnections themselves is becoming more and more significant especially in the ultra scale integrated (ULSI) technology of today. Thus, aluminum, which has been the material of choice since the early days of integrated circuit art, is becoming less attractive than other better conductors such as copper, gold, and silver. Copper is often preferred due to its low resistivity, high electromigration resistance and stress voiding resistance and is used as an interconnect material with the damascene process. However, the removal of excess copper over an overly filled damascene structure by the usual method of chemical mechanical polishing introduces problems associated with metal bridging. The bridging problem across the insulating material within which the damascene structure is formed is further exacerbated by the etching recipe used to form the damascene structure itself, as will be shown later. This problem is further compounded when low dielectric insulating materials are used. As is known in the art, low dielectrics are desired in order to keep capacitance between metal lines low, and especially small RC delays with the ULSI technology where line widths along with feature sizes of less than 0.35 micrometers ($\mu$m) are being developed.

Commensurate with the shrinking line dimensions of the ULSI technology and the attendant chip size, the walls of the grooves formed in the damascene structure need to be vertical so as to conserve "real estate" or space on the chip. When the damascene structure is formed in low dielectric materials, new etching recipes are required which are disclosed later in this invention.

In a single damascene process, incisions, or grooves, are formed in an insulating layer and filled with metal to form conductive lines. Dual damascene takes the process one step further in that, in addition to forming the grooves of a single damascene, the conductive hole openings are also formed in the insulating layer. The resulting composite structure of grooves and holes are filled with metal. The process is repeated as many times as required to form the multi-level interconnections between metal lines and the holes formed in between. Contact holes are formed directly over the substrate where the metal in the hole contacts the surface of the substrate, while the via holes are formed between metal layers.

In contrast, conventionally, the metal layers and the interconnecting layers are formed separately, and serially. First, a first blanket metal is deposited on a first insulating layer and electrical lines are formed by subtractive etching of the metal through a first mask. A second insulating layer is formed over the first metallized layer, and the second insulating layer is patterned with holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new electrical lines, and the process is repeated as many times as it is needed to fabricate a semiconductor substrate.

In the standard dual damascene process an insulating layer, (20), shown in FIG. 1a, is coated with a resist material, (30), which is exposed to a first mask with the image pattern of a hole opening (35') for either a contact or via hole, and the pattern is anisotropically etched, (35), in the upper half (20b) of the insulating layer. The hole depth in the insulating layer can be controlled by timed-etch. That is, the etch is stopped after a predetermined period of time. However, timed-etch is not always reliable. In order to have a better control on the depth of the hole, an etch-stop layer is also used. Thus, hole opening (35) in layer (20) stops at etch-stop layer (25) shown in FIG. 1a. The etchant is then modified to etch the hole pattern through the etch-stop layer and stop at the insulating layer below. After etching, patterned resist material (30) is removed, insulating layer (20) is coated with another resist material (40) and exposed to a second mask with image pattern of conductive lines (45') in alignment with hole openings (35). In anisotropically etching the openings for the conductive line in the upper half of the insulating material, the hole openings already present in the upper half are simultaneously etched in the lower half (20a) of the insulating material. After the etching is complete, both the hole openings and conductive line openings are filled with metal (50), and any excess material on the surface of the substrate is removed by chemical mechanical polishing.

In another approach for the dual damascene process, the conductive line openings, (45'), are etched first into the upper half of the insulating material, (20b), as shown in FIG. 2a, using an etch-stop layer (25). Resist material, (30), is next formed over the substrate, thus filling the line opening (45), and patterned with hole opening (35'), as shown in FIG. 2b. The hole pattern is then etched into the lower half (20a) of the insulating material, thus forming the dual damascene structure. Again, after the etching is complete, both the hole openings and conductive line openings are filled with metal (50), and any excess material on the surface of the substrate is removed by chemical mechanical polishing.

Other variations on the damascene interconnection process are disclosed in U.S. Pat. No. 5,614,765, and U.S. Pat. No. 5,686,354. In the former patent, Avanzino, et al., describe a self aligned via dual damascene where the conductive line openings and vias are filled with the same conductive material. In the latter, also Avanzino , et al., disclose another dual damascene method of fabricating an interconnection level of conductive lines and connecting vias separated by insulation using a thin protective via mask to form the via openings. Shoda in U.S. Pat. No. 5,529,953 proposes a method of manufacturing a semiconductor device having a stud and interconnect in a dual damascene structure using selective deposition. Fiordalice, et al., on the other hand, disclose in U.S. Pat. No. 5,578,523 a method for forming inlaid interconnects in a semiconductor device. Another method for making metal contacts and interconnections concurrently is disclosed by Lee, et al., in U.S. Pat. No. 5,702,982. Jain, et al., use a dielectric tantalum nitride layer as an antireflective coating in a dual damascene structure in U.S. Pat. No. 5,741,626, while Zheng discloses in U.S. Pat. No. 5,705,849 an improved antifuse design by providing a structure comprising pair of alternating layers of silicon nitride and amorphous silicon sandwiched between two dual damascene connectors. Teong teaches an etch stop for a copper damascene process in U.S. Pat. No. 5,693,563. Shan, et al., disclose an adjustable DC bias control in a plasma reactor in U.S. Pat. No. 5,605,637.

The present invention discloses a novel method of etching a combination of low dielectric layers surrounding a copper dual damascene structure where the etching is accomplished in the same chamber in which the hard mask of the dual damascene structure is also etched.

SUMMARY OF THE INVENTION

It is therefore an object of the present invention to provide a method of forming dual damascene interconnects in a semiconductor substrate by using a novel method of etching.

It is another object of this invention to provide a method of etching a dual damascene structure where the upper and lower portions of the damascene structure are embedded in insulating layers having low dielectric constants and separated by an intervening hard mask layer.

It is still another object of this invention to provide a method of etching a dual damascene structure where the upper portion of the damascene structure is embedded in a low dielectric insulating layer while the bottom portion is embedded in an oxide-based insulating layer.

It is yet another object of this invention to provide a method of etching a dual damascene structure where the upper portion of the damascene structure is embedded in a low dielectric insulating layer, the bottom portion is embedded in an oxide-based insulating layer with an intervening hard mask between the two insulating layers. These objects are accomplished by providing a semiconductor substrate having a substructure comprising devices and/or metal lines formed in said substrate; forming a first interlevel dielectric (ILD) layer having low dielectric constant over said substrate; forming a first hard-mask layer over said first ILD layer of low dielectric constant; forming a second ILD layer having low dielectric constant over said first hard-mask layer; forming a second hard-mask layer over said second ILD layer of low dielectric constant;

forming a first photoresist mask having a hole pattern over said second hard-mask layer; etching said hole pattern into said second hard-mask layer underlying said first photoresist mask; removing said first photoresist mask; etching said hole pattern further into said second ILD layer of low dielectric constant underlying said second hard-mask layer; etching said hole pattern further into said first hard-mask layer underlying said second ILD layer of low dielectric constant; forming a second photoresist mask having a groove pattern over said second hard-mask layer; etching said groove pattern into said second hard-mask layer underlying said second photoresist mask; removing said second photoresist mask; etching said groove pattern further into said second ILD layer of low dielectric constant underlying said second hard-mask layer while at the same time etching said hole pattern in said first hard-mask layer further into said first ILD layer of low dielectric constant; performing post cleaning of said dual damascene structure; forming metal in said groove pattern in said second ILD layer of low dielectric constant and in said hole pattern in said first ILD layer of low dielectric constant, thus forming a completed dual damascene interconnect; and removing said metal from the surface of said substrate for subsequent process steps to complete the fabrication of a semiconductor substrate.

These objects are further accomplished by forming two other embodiments of damascene structures having different combinations of oxide-based and low-k (dielectric constant) layers along with hard-masks where novel etch recipes are used to etch the hard-masks and the dielectric layers.

BRIEF DESCRIPTION OF THE DRAWINGS

FIGS. 1a–1c show the forming of a dual damascene structure according to prior art where hole pattern is first formed followed by the forming of the groove pattern.

FIGS. 2a–2c show the forming of a dual damascene structure according to still another prior art method where groove pattern is first formed followed by the forming of the hole pattern.

DESCRIPTION OF THE PREFERRED EMBODIMENTS

Figure 3A:
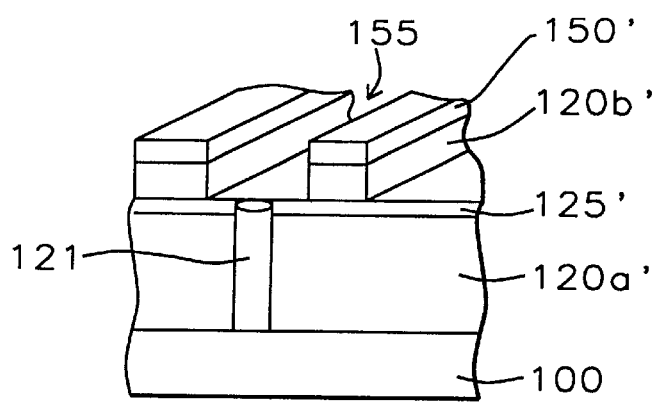
FIG. 3a shows the forming of a dual damascene structure having two insulating layers of the same low-k (dielectric constant) dielectric and two hard-mask layers, according to this invention.
Figure 3B:
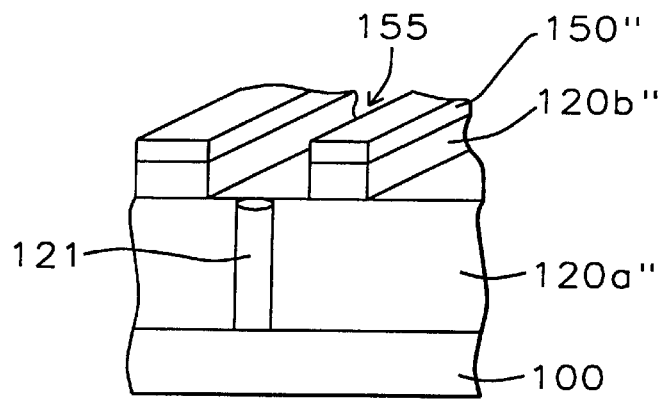
FIG. 3b shows the forming of a dual damascene structure having a hard-mask and two insulating layers where the upper layer is a low-k dielectric while the lower layer is an oxide-based dielectric, according to this invention.
Figure 3C:
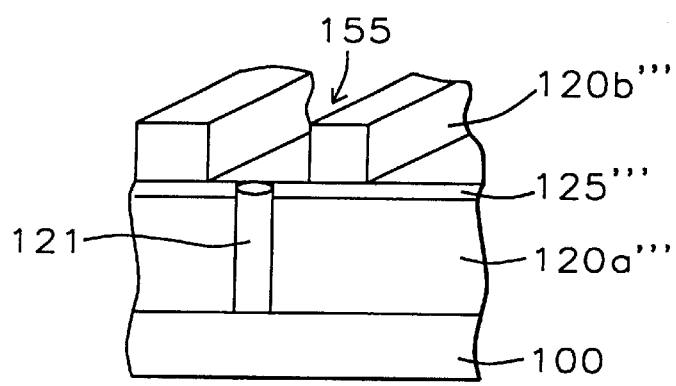
FIG. 3c shows the forming of a dual damascene structure having two insulating layers separated by an intervening hard-mask layer where the upper layer is an oxide-based dielectric while the lower layer is a low-k dielectric, according to this invention.

Referring now to the drawings, in particular to FIGS. 3a–3c, there are shown methods of etching dual damascene structures comprising a combination of different dielectric layers and hard-masks. The main feature of this invention is a combination of recipes which are used in etching the various dielectric layers and the hard-masks therein.

The perspective drawings of FIGS. 3a–3c show a dual damascene structure in a semiconductor substrate (100) where groove pattern (155) for the horizontal interconnect and hole pattern (121) for the vertical interconnect have already been formed. Groove (155) and hole (121) are formed in their respective first and second insulating layers (120b) and (120a), respectively. It will be noted that the method disclosed here is equally applicable to a damascene structure where the vertical portion (121) is a contact hole that reaches the semiconductor substrate or is a via hole that reaches a previously formed damascene interconnect. Usually the dielectric layer disposed between a metal line and the substrate is referred to as an interlevel dielectric layer, while the dielectric layer disposed between a metal line and another metal line at a different level in the substrate is referred to as an intermetal dielectric layer. In order to show the applicability of the method disclosed to either case, the layers will be referred to as first dielectric layer, and second dielectric layer, where the latter is disposed over the former. Also, to avoid confusion of the same layers between different embodiments of the invention, the layers will be primed accordingly. Thus, the first layer in the first embodiment will be primed once, twice in the second embodiment, and thrice in the third embodiment. Parts that are not affected from one embodiment to the other will remain unprimed.

Thus, in FIG. 3a, showing a first embodiment, both first and second dielectric layers, reference characters 120a' and 120b', respectively, have a low dielectric constant, preferably less than 3.0. In a second embodiment of FIG. 3b, the first layer, reference character 120a", is an oxide-based dielectric and the second layer, 120b", is a dielectric also having a low dielectric constant of less than 3.0. In FIG. 3c, the third embodiment of the present invention, the dielectric layer combination is reversed in that the first layer, 120a''', is of low dielectric constant while the second layer, 120b"', is an oxide-based dielectric.

Also, it will be noted that a hard-mask is disclosed whenever the etching of a layer of a low dielectric constant, or low-k, is required in the process. Thus, in FIG. 3a, two hard masks, 125' and 150', are shown to etch the two low-k dielectric layers 120a' and 120b'. In FIG. 3b, only one mask 150" is required to etch second dielectric layer 120b", which is also low-k. Similarly, in FIG. 3c, only one hard mask 125"' is required to etch first dielectric layer 120a"' because it is low-k also. Preferably, the hard-mask is nitride-based. More specifically, FIG. 3a shows a portion of a semiconductor substrate (100), preferably silicon, provided with a substructure of devices (not shown) formed in the substrate or, portions of metal layers thereof (not shown), and as they are not significant to the invention, they are not described in detail in order not to unnecessarily obscure the present invention. First dielectric layer (120a) is formed over a substructure of substrate (100). As dielectric layers are known in the art, they may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, first dielectric layer (120a) comprises $SiO_{3/2}H_{1/2}$, or carbon based low-k dielectric materials known by their trademarks FLARE, and PAE-II and is formed by spin coating yielding a dielectric constant between about 2.8 to 3.4. The thickness of first dielectric layer can be between about 3000 to 6000 Å, but preferably it is between about 6000 to 10000 Å.

Next, a first hard-mask layer (125') is formed over first dielectric layer (120a) as shown in FIG. 3a. The hard-mask layer is nitride-based and performs the function of an etch-stop layer. It is a thin conformal material which can be silicon nitride ($Si_3N_4$, SiN), silicon oxynitride ($SiO_xN_y$) chemical vapor deposited (CVD) by reacting $SiH_4$ with $N_2O$ and He at flow rates between about 60 to 80, 90 to 100 and 100 to 200 sccm, respectively, at a pressure between about 1 to 5 torr, energy between about 120 to 140 watts, and temperature between about 400 to 500° C. The preferred process comprises $Si_3N_4$ and the thickness of the first hard-mask layer (125') is between about 500 to 2000 Å.

After the forming of first dielectric layer (120a') and of first hard-mask layer (125'), a second dielectric layer, also of low dielectric constant, is formed as shown in FIG. 3a. The first and second dielectric layers may be deposited using the same process. A preferred different process, but yielding a low dielectric constant of less than 3.0 to about 2.8 with an upper range of about 4.0 may also be used. Thus, it is preferred that the first dielectric layer has a low-k dielectric constant between about 2.8 to 3.4, while the second dielectric layer has a low-k dielectric constant between about 2.8 to 4.0. It will be apparent to those skilled in the art that other combinations, within the range disclosed, can also be obtained by the appropriate process reactions employed in the forming of the first and second dielectric layers. Subsequently, a second hard-mask layer (150') is formed over the second dielectric layer and to a thickness between about 500 to 2000 Å. It is preferred that the second hard-mask layer is plasma-enhanced oxide (PEOX) formed with $SiH_4$/TEOS (tetraethyl orthosilicate), which is known in the art, and gases $N_2O$, He. The second hard-mask can also be SiON or $SiO_2$ formed by reacting $SiH_4$ with $N_2O$ A first photoresist layer (not shown) of a thickness between about 0.9 to 1.0 $\mu$m is then formed and then patterned with a mask having contact hole pattern.

As a main feature and key aspect of the present invention, the second hard-mask layer, (150') in FIG. 3a, formed over second dielectric layer (120b'), which is also a low-k dielectric, is now etched using a novel reactive ion etch recipe comprising gases $CHF_3/CF_4$/Ar and in a magnetic enhanced reactive ion etcher (MERIE) at a pressure between about 50 to 150 millitorr (mtorr) and energy between about 300 to 800 KeV. MERIE is a single wafer etching machine in which the magnetron principle from sputter deposition is adapted to make the primary electro excitation process in plasma etchers more efficient at lower gas pressures. Alternatively, etching may be performed with $O_2$ in a high-density plasma (HDP) dry etcher using gases $C_2F_6$/$C_4F_8$/Ar at a pressure between about 3 to 10 mtorr. As a result of this etching, contact hole pattern is transferred from the first photoresist mask into second hard-mask layer (155), and afterwards, the photoresist mask is removed with oxygen plasma ashing. The hard-mask will now be used to etch into the underlying dielectric layers forming vertical sidewalls for the damascene structure.

As another important aspect of the present invention, another novel reactive ion etch (RIE) recipe is used to etch the second dielectric layer (120b') having a low dielectric constant and underlying the second hard-mask layer (150'). This oxide etch is also performed in an MERIE with gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts, and between about 10 to 30 gauss in a fixed time mode. It will be noted for completeness that the same etch recipe may be used for etching amorphous carbon low-k dielectric materials FLARE, and PAE-2 mentioned earlier. Also, oxide faceting in the underlying dielectric layer is prevented, especially when the layer is of a low dielectric constant. Faceting usually occurs due to the physical bombardment during etching. A more polymerizing gas mixture can provide protection to the hardmask to prevent faceting. It will be known to those skilled in the art that if faceting occurs, the follow-on chemical-mechanical polishing (CMP) may cause bridging. After the etching into the second dielectric layer, the hole pattern is transferred into the first hard-mask layer (125) by using the same etch recipe that was used for the second hard-mask layer in the MERIE.

A second photoresist mask (not shown) having a groove pattern (155) is formed over the second hard-mask. The preferred thickness of the second photoresist mask is between about 0.8 to 1.0 $\mu$m. The groove pattern is formed into the second hard-mask layer by etching and the second photo-resist mask is removed by oxygen plasma ashing. Using the same etch recipe as before, namely, the earlier disclosed novel reactive ion etch recipe comprising gases $CHF_3/CF_4/Ar$ is used in an MERIE etcher at a pressure between about 50 to 150 millitorr (mtorr) and energy between about 300 to 800 KeV. Next, the other novel reactive ion etch (RIE) recipe is used again to etch the second dielectric layer (120b') having a low dielectric constant and underlying the second hard-mask layer (150'). This oxide etch is also performed in an MERIE with gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts, and between about 10 to 30 gauss in a time mode. It will be appreciated that performing the dielectric etching as well as the hard-mask etching in the same MERIE chamber, and without a vacuum break, will result in increased productivity and cost savings. This etch is continued until the hole pattern formed earlier in the first hard-mask layer is transferred into the first dielectric layer of low dielectric constant. Hence, the dual damascene of the instant invention has been formed using the disclosed etching recipes. Finally, a post cleaning of groove (155) and hole (121) is performed using a recipe comprising amino acid dip—such as chemicals with trademarks ACT690C, ACT935, EKC265—at a temperature between about 25 to 50° C., for about 5 to 10 minutes.

As a final step, the composite groove opening (155) and hole opening (121) structure is filled with metal, preferably copper, and the excess portions of the metal on the surface of the substrate are removed by chemical mechanical polishing (not shown).

In the second embodiment shown in FIG. 3b, the first and second dielectric layers, 120a", 120b", are, respectively, oxide-based and of low dielectric constant. Some oxide-based dielectrics are the well-known PETEOS, BPTEOS, PEOX formed by CVD, with a thickness between about 6000 to 10000 Å. The steps of forming the dual damascene structure of FIG. 3b is similar to that of FIG. 3a except for the absence of a hard-mask as an etch-stop inasmuch as the etch selectivity between the two layers is quite high. A hard-mask layer (150") is still employed for etching the second dielectric layer of low dielectric constant as shown in FIG. 3b. In the third embodiment shown in FIG. 3c a hard-mask (150") is inserted (formed) between the two dielectric layers since it is known from the disclosure of this invention that a dual damascene structure is improved by using such a mask when etching into an insulating layer of low dielectric constant. In both the second and third embodiments, a novel etch method is used to etch the hard-masks, namely, SiON, $SiO_2$ or PEOX as already disclosed in the first embodiment, with a recipe comprising gases $CHF_3/CF_4/Ar$ and in a magnetic enhanced reactive ion etcher (MERIE) at a pressure between about 50 to 150 millitorr (mtorr). The other key etch recipe used in etching the layer of low dielectric constant is also performed in the same MERIE with gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts, and between about 10 to 30 gauss in a time mode. Here too, it will be appreciated that performing the dielectric etching as well as the hard-mask etching in the same MERIE chamber, and without a vacuum break, will result in increased productivity and cost savings. The penultimate step before metallizing the damascene structure with copper metal is post cleaning which is accomplished by employing an amino acid dip at a temperature between about 25 to 50° C. for about 5 to 10 minutes.

Though these numerous details of the disclosed method of etching a dual damascene structure have been set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as whether the damascene structure is formed first by etching a hole pattern followed by the groove pattern, or first by etching a groove pattern followed by hole pattern. Also, the etching method disclosed is equally applicable to a damascene structure having a vertical contact or via hole.

That is, while the invention has been particularly shown and described with reference to the preferred embodiments thereof, it will be understood by those skilled in the art that various changes in form and details may be made without departing from the spirit and scope of the invention.

What is claimed is:

1. A method of etching a dual damascene structure comprising the steps of:

providing a semiconductor substrate having a substructure comprising devices formed in said substrate;

forming a first dielectric layer having a first low dielectric constant (low-k) between about 2.8 to 3.4 over said substrate;

forming a first hard-mask layer over said first dielectric layer of first low-k dielectric constant;

forming a second dielectric layer having a second low dielectric constant (low-k) between about 2.8 to 4.0 over said first hard-mask layer;

forming a second hard-mask layer over said second dielectric layer of second low-k dielectric constant;

wherein said second hard-mask layer is a PEOX formed by reacting $SiH_4$/TEOS with $N_2O$ and He at a temperature between about 400 to 500° C.;

forming a first photoresist mask having a hole pattern over said second hard-mask layer;

etching said hole pattern into said second hard-mask layer underlying said first photoresist mask;

removing said first photoresist mask;

etching said hole pattern further into said second dielectric layer of second low-k dielectric constant underlying said second hard-mask layer;

etching said hole pattern further into said first hard-mask layer underlying said second dielectric layer of second low-k dielectric constant;

forming a second photoresist mask having a groove pattern over said second hard-mask layer;

etching said groove pattern into said second hard-mask layer underlying said second photoresist mask;

removing said second photoresist mask;

etching said groove pattern further into said second dielectric layer of second low-k dielectric constant underlying said second hard-mask layer while at the same time etching said hole pattern in said first hard-mask layer further into said first dielectric layer of first low-k dielectric constant;

performing post cleaning of said dual damascene structure;

depositing metal in said groove pattern in said second dielectric layer of second low-k dielectric constant and in said hole pattern in said first dielectric layer of first low-k dielectric constant, thus forming a completed dual damascene interconnect; and removing the excess metal from the surface of said substrate for subsequent process steps to complete the fabrication of a semiconductor substrate.

2. The method of claim 1, wherein said first dielectric layer comprises $SiO_{3/2}H_{1/2}$, or carbon based low-k dielectric materials is formed by spin coating or by CVD.

3. The method of claim 1, wherein said first dielectric layer of first low-k dielectric constant has a thickness between about 6000 to 10000 Å.

4. The method of claim 1, wherein said forming said first hard-mask layer over said first dielectric layer is accomplished by reacting $SiH_4$ with $N_2O$ and He at a temperature between about 400 to 500° C.

5. The method of claim 4, wherein said first hard-mask layer is SiON or $Si_3N_4$ having a thickness between about 500 to 2000 angstroms (Å).

6. The method of claim 1, wherein said second dielectric layer comprises $SiO_{3/2}H_{1/2}$, or carbon based low-k dielectric materials formed by CVD.

7. The method of claim 1, wherein said second dielectric layer of second low-k dielectric constant has a thickness between about 6000 to 10000 Å.

8. The method of claim 1, wherein said second hard-mask layer has a thickness between about 500 to 2000 angstroms (Å).

9. The method of claim 1, wherein said first photoresist mask has a thickness between about 0.9 to 1.0 μm.

10. The method of claim 1, wherein said etching said hole pattern into said second hard-mask layer underlying said first photoresist mask is accomplished with a recipe comprising gases $CHF_3/CF_4/Ar$ and in a magnetic enhanced reactive ion etcher (MERIE) at a pressure between about 50 to 150 millitorr (mtorr).

11. The method of claim 1, wherein removing said first photoresist mask is accomplished by oxygen plasma ashing.

12. The method of claim 1, wherein said etching said hole pattern further into said second dielectric layer of second low-k dielectric constant underlying said second hard-mask layer is accomplished in an MERIE with a recipe comprising gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts, and between about 10 to 30 gauss in a time mode.

13. The method of claim 1, wherein said etching said hole pattern into said first hard-mask layer underlying said second dielectric layer of second low-k dielectric constant is accomplished with an etch recipe comprising gases $CHF_3/CF_4/Ar$ and in a magnetic enhanced reactive ion etcher (MERIE) at a pressure between about 50 to 150 millitorr (mtorr).

14. The method of claim 1, wherein said second photoresist mask has a thickness between about 0.9 to 1.0 μm.

15. The method of claim 1, wherein said etching said groove pattern into said second hard-mask layer underlying said second photoresist mask is accomplished with a recipe comprising gases $CHF_3/CF_4/Ar$ and in a magnetic enhanced reactive ion etcher (MERIE) at a pressure between about 50 to 150 millitorr (mtorr).

16. The method of claim 1, wherein said etching said groove pattern further into said second dielectric layer of second low-k dielectric constant is accomplished in an MERIE with a recipe comprising gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts, and between about 10 to 30 gauss in a time mode.

17. The method of claim 1, wherein said post cleaning of said damascene structure is accomplished with a recipe comprising amino acid dip, at a temperature between about 25 to 50° C., for about 5 to 10 minutes.

18. The method of claim 1, wherein said depositing metal in said groove pattern in said second dielectric layer of second low-k dielectric constant and in said hole pattern in said first dielectric layer of first low-k dielectric constant is accomplished by depositing copper.

19. The method of claim 1, wherein said removing the excess metal from the surface of said substrate is accomplished by chemical mechanical polishing.

20. A method of etching a dual damascene structure comprising the steps of:

providing a semiconductor substrate having a substructure comprising devices formed in said substrate;

forming an oxide-based first dielectric layer over said substrate;

forming a second dielectric layer having a second low dielectric constant (low-k) between about 2.8 to 4.0 over said first oxide-based dielectric layer;

forming a hard-mask layer over said second dielectric layer of second low-k dielectric constant;

forming a first photoresist mask having a hole pattern over said hard-mask layer;

etching said hole pattern into said hard-mask layer underlying said first photoresist mask;

wherein said etching said hole pattern into said hard-mask layer is accomplished with a recipe comprising gases $CHF_3/CF_4/Ar$ and in a magnetic enhanced reactive ion etcher (MERIE) at a pressure between about 50 to 150 millitorr (mtorr);

removing said first photoresist mask;

etching said hole pattern further into said second dielectric layer of second low-k dielectric constant underlying said hard-mask layer;

etching said hole pattern further into said oxide-based first dielectric layer;

forming a second photoresist mask having a groove pattern over said hard-mask layer;

etching said groove pattern into said hard-mask layer underlying said second photoresist mask;

removing said second photoresist mask;

etching said groove pattern further into said second dielectric layer of second low-k dielectric constant underlying said hard-mask layer;

performing post cleaning of said dual damascene structure;

depositing metal in said groove pattern in said second dielectric layer of second low-k dielectric constant and in said hole pattern in said oxide-based first dielectric layer, thus forming a completed dual damascene interconnect; and removing the excess metal from the surface of said substrate for subsequent process steps to complete the fabrication of a semiconductor substrate.

21. The method of claim 20, wherein said oxide-based said first dielectric layer comprises PETEOS and is formed by CVD.

22. The method of claim 20, wherein said oxide-based said first dielectric layer has a thickness between about 6000 to 10000 Å.

23. The method of claim 20, wherein said second dielectric layer having second low-k dielectric constant is formed by CVD.

24. The method of claim 20, wherein said second dielectric layer of second low-k dielectric constant has a thickness between about 6000 to 10000 Å.

25. The method of claim 20, wherein said forming said hard-mask layer over said second dielectric layer is accomplished by reacting $SiH_4$ with $N_2O$ at a temperature between about 400 to 500° C.

26. The method of claim 20, wherein said hard-mask layer comprises SiON or $SiO_2$ having a thickness between about 500 to 2000 angstroms (Å).

27. The method of claim 20, wherein said first photoresist mask has a thickness between about 0.9 to 1.0 $\mu$m.

28. The method of claim 20, wherein removing said first photoresist mask is accomplished by oxygen plasma ashing.

29. The method of claim 20, wherein said etching said hole pattern further into said second dielectric layer of second low-k dielectric constant is accomplished in an MERIE with a recipe comprising gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts, and between about 10 to 30 gauss in a time mode.

30. The method of claim 20, wherein etching said hole pattern further into said oxide-based said first dielectric layer is accomplished with an etch recipe comprising gases nitrogen, oxygen, $CHF_3$ and CO at a pressure between about 25 to 40 mtorr at an energy level between about 300 to 800 KEV.

31. The method of claim 20, wherein said second photoresist mask has a thickness between about 0.9 to 1.0 $\mu$m.

32. The method of claim 20, wherein said etching said groove pattern into said hard-mask layer underlying said second photoresist mask is accomplished with a recipe comprising gases $CHF_3/CF_4$/Ar and in a magnetic enhanced reactive ion etcher (MERIE) at a pressure between about 50 to 150 millitorr (mtorr).

33. The method of claim 20, wherein said etching said groove pattern further into said second dielectric layer of second low-k dielectric constant underlying said hard-mask layer is accomplished in an MERIE with a recipe comprising gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts, and between about 10 to 30 gauss in a time mode.

34. The method of claim 20, wherein said post cleaning of said damascene structure is accomplished with a recipe comprising amino acid dip, at a temperature between about 25 to 50° C., for about 5 to 10 minutes.

35. The method of claim 20,, wherein said depositing metal in said groove pattern in said second dielectric layer of second low-k dielectric constant and in said hole pattern in said oxide-based said first dielectric layer is accomplished by depositing copper.

36. The method of claim 20, wherein said removing the excess metal from the surface of said substrate is accomplished by chemical mechanical polishing.

37. A method of etching a dual damascene structure comprising the steps of:
   providing a semiconductor substrate having a substructure comprising devices formed in said substrate;
   forming a first dielectric layer having a first low dielectric constant (low-k) between about 2.8 to 3.4 over said substrate;
   forming a hard-mask layer over said first dielectric layer of first low-k dielectric constant;
   forming an oxide-based second dielectric layer over said hard-mask layer;
   forming a first photoresist mask having a hole pattern over said hard-mask layer;
   etching said hole pattern into said oxide-based said second dielectric layer underlying said first photoresist mask;
   etching said hole pattern further into said hard-mask layer underlying said oxide-based second dielectric layer;
   wherein said etching said hole pattern further into said hard-mask layer is accomplished with a recipe comprising gases $CHF_3/CF_4$/Ar and in a magnetic enhanced reactive ion etcher (MERIE) at a pressure between about 50 to 150 millitorr (mtorr);
   removing said first photoresist mask;
   forming a second photoresist mask having a groove pattern over said substrate including said hole pattern;
   etching said groove pattern into said oxide-based said second dielectric layer while at the same time etching said hole pattern in said hard-mask layer further into said first dielectric layer of first low-k dielectric constant;
   removing said second photoresist mask;
   performing post cleaning of said dual damascene structure;
   depositing metal in said groove pattern in said oxide-based said second dielectric layer and in said hole pattern in said first dielectric layer of first low-k dielectric constant, thus forming a completed dual damascene interconnect; and
   removing the excess metal from the surface of said substrate for subsequent process steps to complete the fabrication of a semiconductor substrate.

38. The method of claim 37, wherein said first dielectric layer comprises PETEOS formed by CVD.

39. The method of claim 37, wherein said first dielectric layer of first low-k dielectric constant has a thickness between about 6000 to 10000 Å.

40. The method of claim 37, wherein said forming said hard-mask layer over said first dielectric layer of first low-k dielectric constant is accomplished by reacting $SiH_4$ with $N_2O$ and He at a temperature between about 400 to 500° C.

41. The method of claim 40, wherein said hard-mask layer is SION or $Si_3N_4$ having a thickness between about 500 to 2000 angstroms (Å).

42. The method of claim 39, wherein said oxide-based said second dielectric layer comprises BPTEOS formed by CVD.

43. The method of claim 42, wherein said oxide-based said second dielectric layer has a thickness between about 6000 to 10000 Å.

44. The method of claim 37, wherein said first photoresist mask has a thickness between about 0.9 to 1.0 $\mu$m.

45. The method of claim 37, wherein said etching said hole pattern into said oxide-based said second dielectric layer underlying said first photoresist mask is accomplished with a recipe comprising gases nitrogen, oxygen, $CHF_3$ (or $CH_3F$) and CO at respective flow rates between about 40 to 50 standard cubic centimeters per minutes (sccm), 10 to 20 sccm, 5 to 15 sccm and 1 to 10 sccm, at a pressure between about 25 to 40 mtorr at an energy level between about 1000 to 1100 watts.

46. The method of claim 37, wherein said post cleaning of said damascene structure is accomplished with a recipe comprising amino acid dip, at a temperature between about 25 to 50° C., for about 5 to 10 minutes.

47. The method of claim 37, wherein said depositing metal in said groove pattern in said oxide-based said second dielectric layer and in said hole pattern in said first dielectric layer of first low-k dielectric constant is accomplished by depositing copper.

48. The method of claim 37, wherein said removing the excess metal from the surface of said substrate is accomplished by chemical mechanical polishing.

\* \* \* \* \*